(12) United States Patent
Han et al.

(10) Patent No.: US 10,566,323 B2
(45) Date of Patent: Feb. 18, 2020

(54) SCAN DRIVER AND DISPLAY DEVICE HAVING THE SAME

(71) Applicant: Samsung Display Co., Ltd., Yongin-si, Gyeonggi-do (KR)

(72) Inventors: Jee Hoon Han, Yongin-si (KR); Won Jun Lee, Yongin-si (KR); Kyung Suk Jung, Yongin-si (KR); Yong Tae Cho, Yongin-si (KR); O Sung Seo, Yongin-si (KR); Yun Seok Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 165 days.

(21) Appl. No.: 15/798,921

(22) Filed: Oct. 31, 2017

(65) Prior Publication Data

US 2018/0182748 A1 Jun. 28, 2018

(30) Foreign Application Priority Data

Dec. 28, 2016 (KR) .......................... 10-2016-0181007

(51) Int. Cl.
| | | |
|---|---|---|
| *H01L 27/02* | (2006.01) | |
| *H01L 27/12* | (2006.01) | |
| *H01L 29/417* | (2006.01) | |
| *H01L 29/49* | (2006.01) | |
| *G09G 3/36* | (2006.01) | |
| *G02F 1/1362* | (2006.01) | |
| *G02F 1/1335* | (2006.01) | |
| *G02F 1/1368* | (2006.01) | |

(52) U.S. Cl.
CPC ....... *H01L 27/0266* (2013.01); *G09G 3/3677* (2013.01); *H01L 27/1244* (2013.01); *H01L 27/1255* (2013.01); *H01L 29/41733* (2013.01); *H01L 29/4908* (2013.01); *G02F 1/1368* (2013.01); *G02F 1/133514* (2013.01); *G02F 1/136286* (2013.01); *G02F 2202/103* (2013.01); *G09G 2300/0413* (2013.01); *G09G 2300/0426* (2013.01); *G09G 2300/0819* (2013.01); *G09G 2330/04* (2013.01)

(58) Field of Classification Search
None
See application file for complete search history.

(56) References Cited

U.S. PATENT DOCUMENTS

| | | | |
|---|---|---|---|
| 8,551,872 B2 | 10/2013 | Chen et al. | |
| 2016/0140897 A1* | 5/2016 | Park ..................... | G09G 3/3225 345/77 |
| 2016/0300974 A1* | 10/2016 | Yeo ....................... | G06F 3/0421 |

* cited by examiner

*Primary Examiner* — Kenneth B Lee, Jr.
(74) *Attorney, Agent, or Firm* — Innovation Counsel LLP

(57) ABSTRACT

A scan driver has a plurality of stages configured to supply a scan signal to scan lines. The plurality of stages include a stage coupled to a scan line of the scan lines. The stage includes a first transistor including a gate electrode, a drain electrode and a source electrode and is configured to output the scan signal to the scan line; a second transistor provided on a side of the first transistor and connected to the drain electrode; a third transistor provided on the side of the first transistor and connected to the source electrode; a capacitor provided between the scan line and the first transistor; a first dummy transistor provided between the first transistor and the capacitor and connected to the capacitor; and a second dummy transistor provided between the first transistor and the second transistor and connected to both the first transistor and the second transistor.

15 Claims, 4 Drawing Sheets

SCAN DRIVER AND DISPLAY DEVICE HAVING THE SAME

CROSS-REFERENCE TO RELATED APPLICATION

The present application claims priority to Korean patent application no. 10-2016-0181007 filed on Dec. 28, 2016, the entire disclosure of which is incorporated herein in its entirety by reference.

BACKGROUND

Field of Disclosure

Various embodiments of the present disclosure relate to a scan driver and a display device having the scan driver.

Description of Related Art

Generally, a display device includes a display panel having a plurality of pixels to display an image, a scan driver providing a gate signal to the pixels, and a data driver providing a data signal to the pixels.

In the display device, the scan driver and the data driver mount a driver IC in a method of a tape carrier package (TCP), a chip on film (COF) or the like. However, other methods are being researched in consideration of manufacturing cost or a size of a product. Particularly, a method of directly mounting the scan driver on a substrate using a thin film transistor without adopting the driver IC is being researched.

In order to manufacture the scan driver, a plurality of charges is accumulated on a data line, a scan line, or a gate insulator in the process of forming a plurality of thin film transistors. If static electricity exceeds a predetermined level in the scan driver during the operation of the display device, the static electricity destroys the thin film transistor in the scan driver, thus possibly causing performance degradation of the display device.

SUMMARY

Various embodiments of the present disclosure are directed to a scan driver that is resistant to static electricity.

Furthermore, various embodiments of the present disclosure are directed to a display device having the scan driver.

The present disclosure provides a scan driver including a plurality of stages configured to supply a scan signal to scan lines. The plurality of stages may include a stage coupled to a scan line of the scan lines. The stage may include a first transistor including a first gate electrode, a first drain electrode and a first source electrode and may be configured to output the scan signal to the scan line; a second transistor provided on a side of the first transistor and connected to the first drain electrode; a third transistor provided on the side of the first transistor and connected to the first source electrode; a capacitor provided between the scan line and the first transistor; a first dummy transistor provided between the first transistor and the capacitor and connected to the capacitor; and a second dummy transistor provided between the first transistor and the second transistor and connected to both the first transistor and the second transistor.

The first source electrode and the first drain electrode may overlap with the first gate electrode, and each of the first source electrode and the first drain electrode may include a stem extending in one direction and a plurality of branches protruding from the stem.

The branches of the first source electrode may protrude towards the stem of the first drain electrode, and the branches of the first drain electrode may protrude towards the stem of the first source electrode, and the branches of the first source electrode and the first drain electrode may be alternately arranged.

The capacitor may include a lower electrode connected to the first gate electrode; and an upper electrode connected to the first drain electrode.

The first dummy transistor may include a first dummy gate electrode connected to the first gate electrode and the lower electrode and including amorphous silicon; a first dummy drain electrode overlapping with the first dummy gate electrode and connected to the first drain electrode and the upper electrode; and a first dummy source electrode overlapping with the first dummy gate electrode, the first dummy source electrode spaced apart from the first dummy drain electrode and connected to the upper electrode.

Each of the first dummy source electrode and the first dummy drain electrode may include a stem extending in one direction and a plurality of branches protruding from the stem. The branches of the first dummy source electrode may protrude towards the stem of the first dummy drain electrode and the branches of the first dummy drain electrode may protrude towards the stem of the first dummy source electrode, and the branches of the first dummy source electrode and the first dummy drain electrode may be alternately arranged.

The second dummy transistor may include a second dummy gate electrode connected to the first gate electrode and including amorphous silicon; a second dummy drain electrode overlapping with the second dummy gate electrode and connected to the first drain electrode and the second transistor; and a plurality of second dummy source electrodes overlapping with the second dummy gate electrode and spaced apart from the second dummy drain electrode.

The second dummy drain electrode may include a dummy stem extending in one direction and a plurality of dummy branches protruding from the dummy stem, and the second dummy source electrodes may be electrically isolated from each other and the second dummy source electrodes and the dummy branches may be alternately arranged.

The first gate electrode may include amorphous silicon.

The present disclosure provides a display device including a pixel unit configured to display an image; the scan driver configured to supply a scan signal through a scan line to the pixel unit, and including a plurality of stages; and a data driver configured to supply a data signal to the pixel unit.

DETAILED DESCRIPTION

Figure 1:
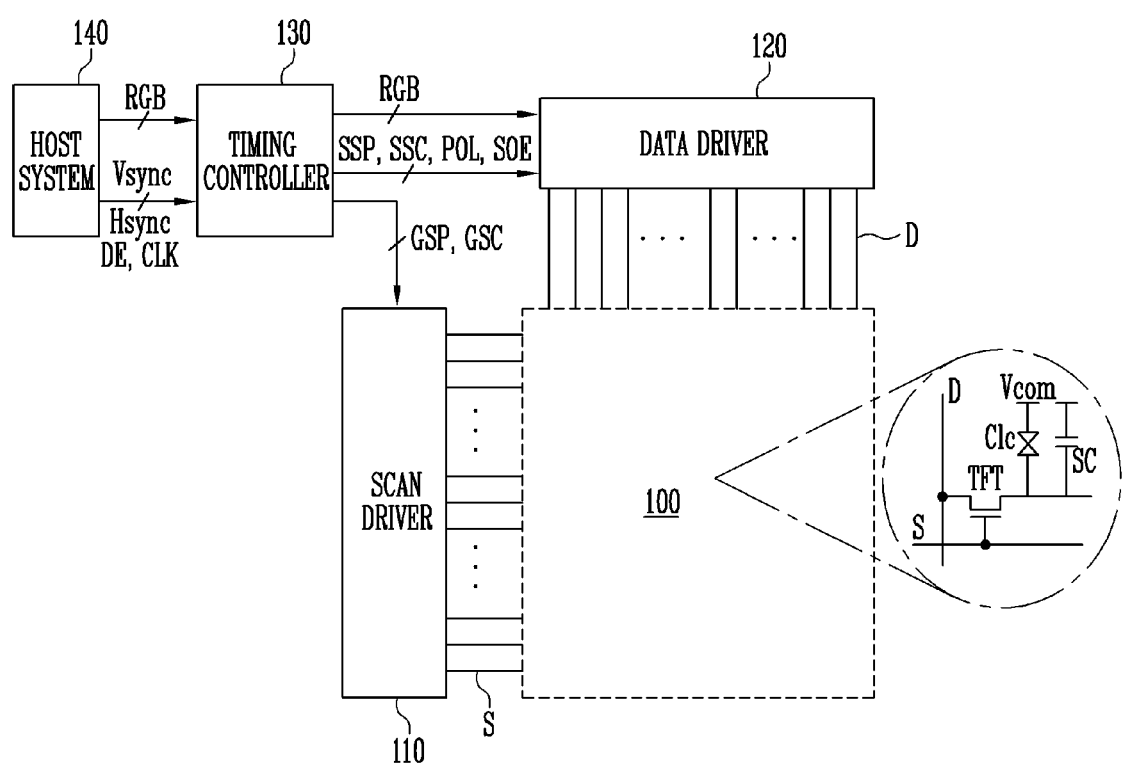
FIG. 1 is a block diagram illustrating a display device according to an embodiment of the present disclosure.

The above and other features of the disclosure will be described more fully hereinafter with reference to the accompanying drawings, in which example embodiments are shown. While an embodiment has been described using specific terms, such description is for illustrative purposes only, and it is to be understood that changes, equivalences and substitutions may be made without departing from the spirit or scope of the following claims.

Like reference numerals are used to identify like elements throughout different drawings. In the drawings, dimensions of structures may be exaggerated for clarity. Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, a singular form may include a plural form as long as it is not specifically mentioned in a sentence as being otherwise.

Furthermore, the term "include/comprise" used in the specification represents that one or more features, figures, steps, operations, elements, components or a combination thereof exist or are added. Furthermore, the expression, a part such as a layer, a film, a region, a plate or the like is located "on" another part, refers to a part not only formed "directly above" another part but also a part formed above another part with an intermediate part therebetween. Furthermore, the expression 'a part such as a layer, a film, a region, a plate or the like is located on another part' covers an arrangement at an upper position, a side position, and a lower position. On the other hand, the expression, a part such as a layer, a film, a region, a plate or the like is located "under" another part, refers to a part not only formed "directly under" another part but also a part formed under another part with an intermediate part therebetween.

Hereinafter, embodiments of the present disclosure will be described in greater detail with reference to the accompanying drawings.

FIG. 1 is a block diagram schematically illustrating the display device according to the embodiment of the present disclosure. Although it is shown in FIG. 1 that the display device is a liquid crystal display device for the convenience of description, the present disclosure is not limited thereto.

Referring to FIG. 1, the display device may include a pixel unit 100, a scan driver 110, a data driver 120, a timing controller 130, and a host system 140.

The pixel unit 100 may be a region in which an image is displayed, and may mean an effective display of a display panel. The display panel may be the liquid crystal display panel. The display panel may include a thin film transistor (hereinafter referred to as a "TFT") substrate and a color filter substrate. A liquid crystal layer may be provided between the TFT substrate and the color filter substrate. Data lines D and scan lines S may be formed on the TFT substrate, and a plurality of pixels may be arranged in a region defined by the scan lines S and the data lines D.

The TFT included in each of the pixels (not shown) may transmit a voltage of a data signal supplied from a corresponding one of the data lines D to a liquid crystal capacitor Clc, in response to a scan signal supplied from a corresponding one of the scan lines S. To this end, a gate electrode of the TFT may be connected to the scan line S, and a first electrode of the TFT may be connected to the data line D. A second electrode of the TFT may be connected to the liquid crystal capacitor Clc and a storage capacitor SC.

In this regard, the first electrode may mean one of a source electrode and a drain electrode of the TFT, while the second electrode may mean a remaining one of the source electrode and the drain electrode of the TFT. For example, when the first electrode is set as the drain electrode, the second electrode may be set as the source electrode. Furthermore, the liquid crystal capacitor Clc equivalently expresses liquid crystals between a pixel electrode (not shown) and a common electrode (not shown), which are formed on the TFT substrate. The storage capacitor SC may maintain the voltage of the data signal transmitted to the pixel electrode for a predetermined time until a next data signal is supplied.

A black matrix, the color filter and the like may be provided on the color filter substrate.

The common electrode may be provided on the color filter substrate in a vertical field driven method such as a Twisted Nematic (TN) mode and a Vertical Alignment (VA) mode. Furthermore, the common electrode may be provided on the TFT substrate along with the pixel electrode, in a horizontal field driven method such as an In Plane Switching (IPS) mode and a Fringe Field Switching (FFS) mode. A common voltage Vcom may be provided to the common electrode. Furthermore, a liquid crystal mode of the display panel may be implemented in any liquid crystal mode including the above-described TN mode, VA mode, IPS mode and FFS mode.

The data driver 120 may convert image data RGB inputted from the timing controller 130 into a positive/negative gamma correction voltage, and then may generate positive/negative analog data voltages. The positive/negative analog data voltage generated from the data driver 120 may be supplied to the data lines D as the data signal.

The scan driver 110 may supply the scan signal to the scan lines S. For example, the scan driver 110 may sequentially supply the scan signal to the scan lines S. If the scan signal is sequentially supplied to the scan lines S, the pixels may be selected based on a horizontal line, and the pixels selected by the scan signal may be supplied with the data signal. To this end, the scan driver 110 may be provided with stages (not shown) that are connected to the scan lines S, respectively. The scan driver 110 may be mounted on the display panel in the form of an amorphous silicon gate (ASG) driver. That is, the scan driver 110 may be mounted on the TFT substrate through a thin film process. Furthermore, scan drivers 110 may be mounted on both sides of the display panel while being arranged on opposite sides of the pixel unit 100.

The timing controller 130 may supply a gate control signal to the scan driver 110 based on timing signals including the image data RGB outputted from the host system 140, a vertical synchronous signal Vsync, a horizontal synchronous signal Hsync, a data enable signal DE, a clock signal CLK, etc., and may supply the data control signal to the data driver 120.

The gate control signal may include a gate start pulse GSP, one or more gate shift clocks GSC, etc. The gate start pulse GSP may control the timing of a first scan signal. The gate shift clock GSC means one or more clock signals for shifting the gate start pulse GSP.

The data control signal may include a source start pulse SSP, a source sampling clock SSC, a source output enable signal SOE, a polarity control signal POL, etc. The source start pulse SSP may control a data sampling start time of the data driver 120. The source sampling clock SSC may control a sampling operation of the data driver 120 based on a rising or falling edge. The source output enable signal SOE may control the output timing of the data driver 120. The polarity control signal POL may reverse the polarity of the data signal outputted from the data driver 120.

The host system 140 may supply the image data RGB to the timing controller 130 via an interface such as Low Voltage Differential Signaling (LVDS) and Transition Minimized Differential Signaling (TMDS). Furthermore, the host system 140 may supply the timing signals Vsync, Hsync, DE and CLK to the timing controller 130.

Figure 2:
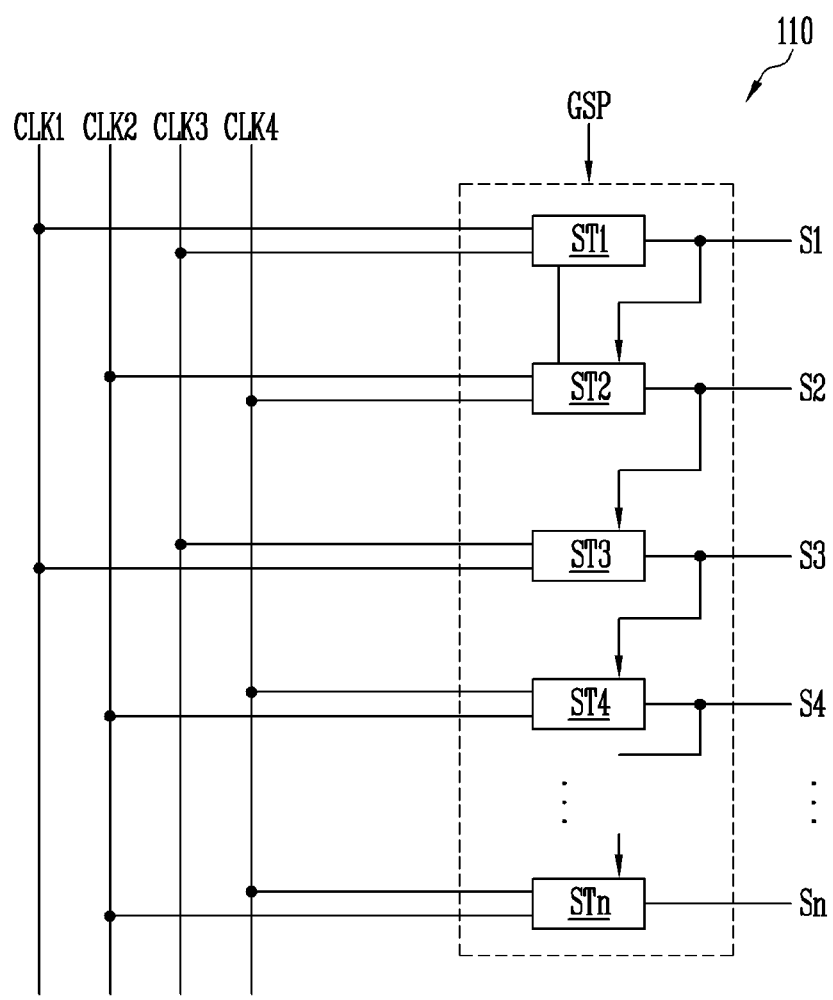
FIG. 2 is a view schematically illustrating a scan driver shown in FIG. 1.

FIG. 2 is a view schematically illustrating the scan driver 110 shown in FIG. 1.

Referring to FIG. 2, the scan driver 110 may include a plurality of stages ST1 to STn.

Each of the stages ST1 to STn may be connected with one of the scan lines S1 to Sn, and may supply the scan signal to the scan lines Si to Sn in response to the gate start pulse (GSP). For example, an i-th (i is a natural number) stage STi may be connected to an i-th scan line, and may supply the scan signal to the i-th scan line.

Each of the stages ST1 to STn may be supplied with at least one, for example, two clocks signals of the plurality of clock signals CLK1 to CLK4. For example, the first stage ST1 may be supplied with the first clock signal CLK1 and the third clock signal CLK3. The second stage ST2 may be supplied with the second clock signal CLK2 and the fourth clock signal CLK4. The third stage ST3 may be supplied with the third clock signal CLK3 and the first clock signal CLK1. The fourth stage ST4 may be supplied with the fourth clock signal CLK4 and the second clock signal CLK2. The connecting configuration of the first to fourth stages ST1 to ST4 may be repetitively applied to subsequent stages.

The first to fourth clock signals CLK1 to CLK4 may be a square-wave signal repeating a high voltage (high section) and a low voltage (low section). Here, the high voltage may be set as a gate on voltage so that transistors included in the stage may be turned on, and the low voltage may be set as a gate off voltage so that transistors included in the stage may be turned off. The first to fourth clock signals CLK1 to CLK4 may be sequentially supplied so that their high sections do not overlap with each other Furthermore, although only n stages ST1 to STn are shown in FIG. 2, the present disclosure is not limited thereto. For example, the scan driver 110 may be further provided with a plurality of dummy stages to ensure the stability of driving.

Figure 3:
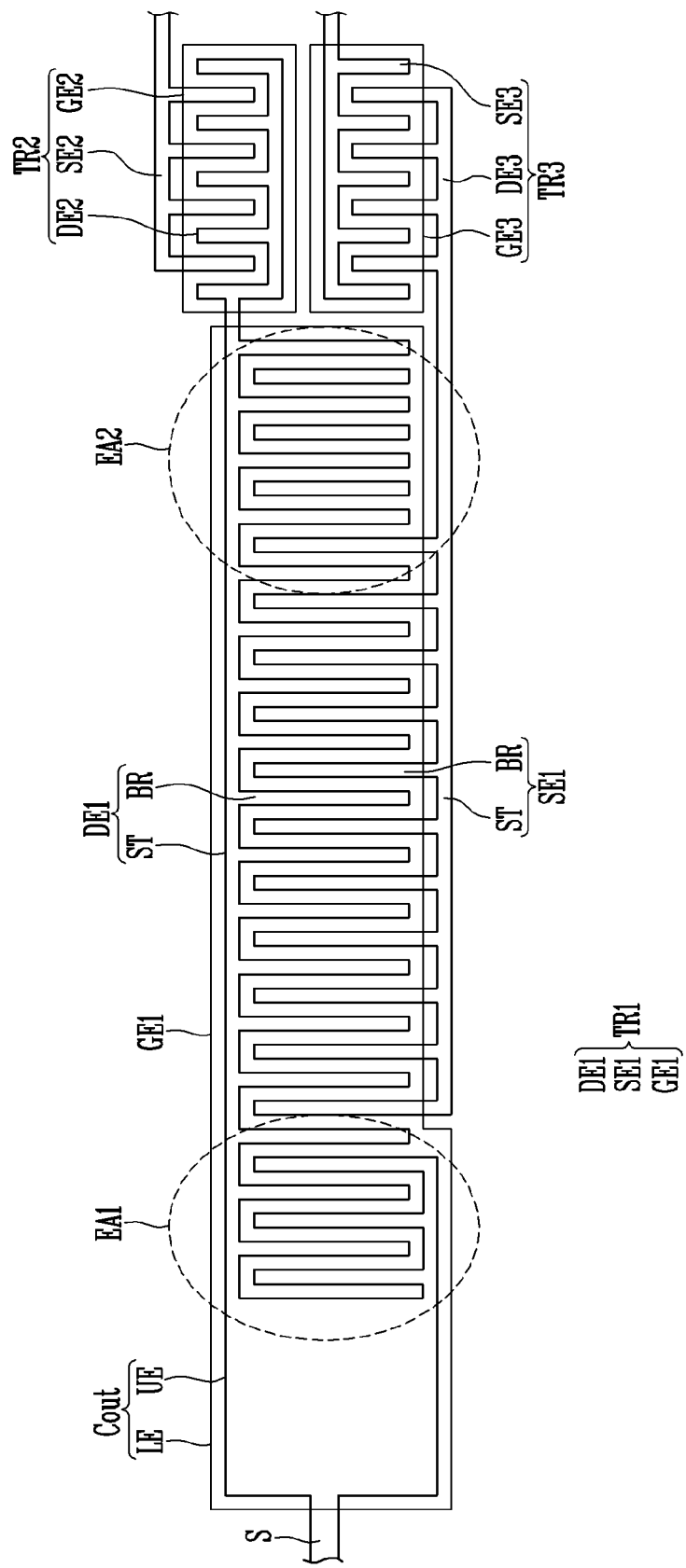
FIG. 3 is a plan view of a part of a stage shown in FIG. 2.
Figure 4:
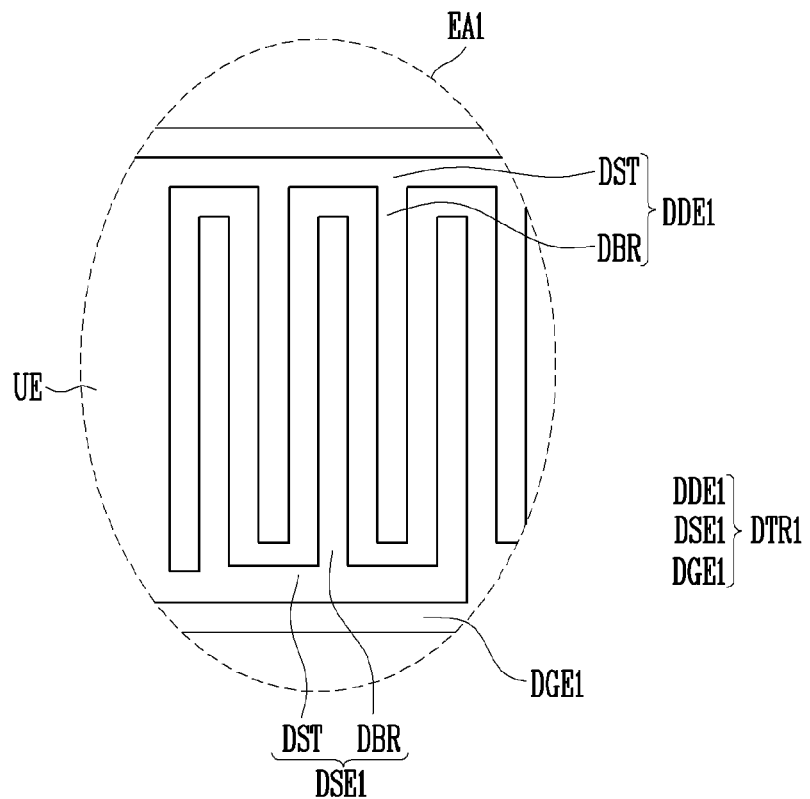
FIG. 4 is an enlarged view of a region EA1 of FIG. 3.
Figure 5:
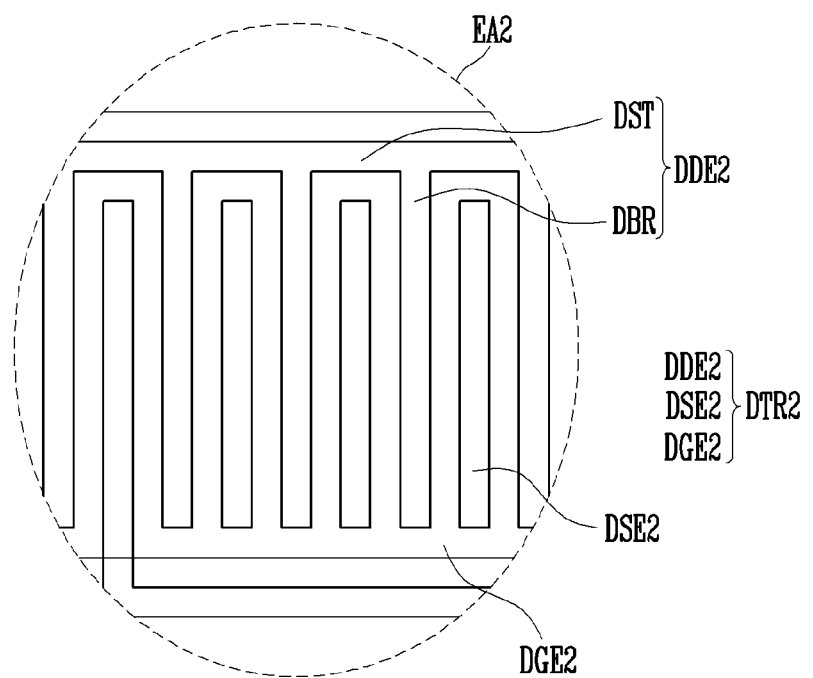
FIG. 5 is an enlarged view of a region EA2 of FIG. 3.

FIG. 3 is a plan view of a part of a stage shown in FIG. 2, FIG. 4 is an enlarged view of a region EA1 of FIG. 3, and FIG. 5 is an enlarged view of a region EA2 of FIG. 3.

Referring to FIGS. 1 to 5, the stages ST1, ST2, ST3, ST4 and STn of the scan driver 110 may receive two clock signals and may output a scan signal in response to the clock signals. The stages ST1, ST2, ST3, ST4 and STn of the scan driver 110 may include at least one transistor TR1, TR2, TR3, a capacitor Cout, a first dummy transistor DTR1, and a second dummy transistor DTR2.

The stages ST1, ST2, ST3, ST4 and STn may include a first transistor TR1, a second transistor TR2, and a third transistor TR3.

The first transistor TR1 includes a first gate electrode GE1, a first source electrode SE1, and a first drain electrode DEL The first gate electrode GE1 may receive the two clock signals, and the first transistor TR1 may output the scan signal to the corresponding scan line S of the scan lines 51 to Sn through the capacitor Cout in response to the two clock signals.

The first gate electrode GE1 may be provided under the first source electrode SE1 and the first drain electrode DE1, and may have the shape of a plate. The first gate electrode GE1 may include amorphous silicon.

The first source electrode SE1 and the first drain electrode DE1 may overlap with the first gate electrode GE1. The first source electrode SE1 and the first drain electrode DE1 may be provided on the first gate electrode GE1, and may be arranged to be spaced apart from each other. The first source electrode SE1 and the first drain electrode DE1 may at least partially overlap with the first gate electrode GE1.

Each of the first source electrode SE1 and the first drain electrode DE1 may include a stem ST extending in one direction, and a plurality of branches BR protruding from the stem ST. The stem ST of the first source electrode SE1 and the stem ST of the first drain electrode DE1 may be parallel to each other. The branches BR of the first source electrode SE1 may protrude towards the stem ST of the first drain electrode DEL The branches BR of the first drain electrode DE1 may protrude towards the stem ST of the first source electrode SEL Furthermore, the branches BR of the first source electrode SE1 and the branches BR of the first drain electrode DE1 may be alternately arranged.

The second transistor TR2 and the third transistor TR3 may be provided on a side of the first transistor TR1.

The second transistor TR2 may receive one of the two clock signals and transmit the one of the two clock signals to the first transistor TR1. The second transistor TR2 includes a second gate electrode GE2, a second source electrode SE2, and a second drain electrode DE2. The second drain electrode DE2 may be connected to the first drain electrode DEL For example, the second drain electrode DE2 may be connected to the stem ST of the first drain electrode DEL The second source electrode SE2 and the second drain electrode DE2 may include a stem extending in one direction, and a plurality of branches protruding from the stem, similarly to the first source electrode SE1 and the first drain electrode DEL The third transistor TR3 may receive other of the two clock signals and transmit the other of the two clock signals to the first transistor TR1. The third transistor TR3 includes a third gate electrode GE3, a third source electrode SE3, and a third drain electrode DE3. The third drain electrode DE3 may be connected to the first source electrode SE1. For example, the third drain electrode DE3 may be connected to the stem ST of the first source electrode SE1. The third source electrode SE3 and the third drain electrode DE3 may include a stem extending in one direction, and a plurality of branches protruding from the stem, similarly to the first source electrode SE1 and the first drain electrode DEL The capacitor Cout may receive the scan signal from the first transistor TR1 and output the scan signal to the scan line. The capacitor Cout may be provided on the other side of the first transistor TR1 and may be connected to the first drain electrode DE1 The capacitor Cout may include a lower electrode LE, and an upper electrode UE. The lower electrode LE may be connected to the first gate electrode GE1. For example, the lower electrode LE may have an extended shape of the first gate electrode GE1. The upper electrode UE may be connected to the first drain electrode DE1, and may at least partially overlap with the lower electrode LE. Although it is shown in FIGS. 3 to 5 that an area of the lower electrode LE is larger than an area of the upper electrode UE, by way of example, the disclosure is not limited thereto. For example, the area of the lower electrode LE may be equal to or larger than the area of the upper electrode UE.

A first dummy transistor DTR1 may be provided between the first transistor TR1 and the capacitor Cout. The first dummy transistor DTR1 may include a first dummy gate electrode DGE1, a first dummy source electrode DSE1, and a first dummy drain electrode DDE1.

The first dummy gate electrode DGE1 may be provided between the first gate electrode GE1 and the lower electrode LE, and may be connected to the first gate electrode GE1 and the lower electrode LE. The first dummy gate electrode DGE1 may include amorphous silicon. The first dummy gate electrode DGE1 may have an extended shape of the first gate electrode GE1. That is, the first gate electrode GE1, the first dummy gate electrode DGE1 and the lower electrode LE may be electrically connected to each other. The first dummy drain electrode DDE1 may be provided between the first drain electrode DE1 and the upper electrode UE, and connected to the first drain electrode DE1 and the upper electrode UE. The first dummy source electrode DSE1 may be connected to the upper electrode UE of the capacitor Cout, and may be arranged to be spaced apart from the first dummy drain electrode DDE1.

Each of the first dummy source electrode DSE1 and the first dummy drain electrode DDE1 may include a dummy stem DST extending in one direction, and a plurality of dummy branches DBR protruding from the dummy stem DST. The dummy stem DST of the first dummy source electrode DSE1 and the dummy stem DST of the first dummy drain electrode DDE1 may be parallel to each other. The dummy branches DBR of the first dummy source electrode DSE1 may protrude towards the dummy stem DST of the first dummy drain electrode DDE1. The dummy branches DBR of the first dummy drain electrode DDE1 may protrude towards the dummy stem DST of the first dummy source electrode DSE1.

Furthermore, the dummy branches DBR of the first dummy source electrode DSE1 and the dummy branches DBR of the first dummy drain electrode DDE1 may be alternately arranged.

The second dummy transistor DTR2 may be provided between the first transistor TR1, the second transistor TR2, and the third transistor TR3. The second dummy transistor DTR2 may include a second dummy gate electrode DGE2, a plurality of second dummy source electrodes DSE2, and a second dummy drain electrode DDE2.

The second dummy gate electrode DGE2 may be connected to the first gate electrode GE1, and spaced apart from the second gate electrode GE2. The second dummy gate electrode DGE2 may include amorphous silicon. For example, the second dummy gate electrode DGE2 may have an extended shape of the first gate electrode GE1.

The second dummy drain electrode DDE2 may be provided between the first drain electrode DE1 and the second drain electrode DE2, and may be connected to the first drain electrode DE1 and the second drain electrode DE2.

The second dummy drain electrode DDE2 may include a dummy stem DST extending in one direction, and a plurality of dummy branches DBR protruding from the dummy stem DST.

The second dummy source electrodes DSE2 may be arranged in a region between the dummy branches DBR of the second dummy drain electrode DDE2. The dummy branches DBR of the second dummy drain electrode DDE2 and the second dummy source electrodes DSE2 may be alternately arranged. The second dummy source electrodes DSE2 may be electrically isolated from each other.

Generally, in the stages ST1, ST2, ST3, ST4 and STn, a problem such as short-circuit due to static electricity may occur at both ends of the first transistor TR1. However, the stages ST1, ST2, ST3, ST4 and STn of the scan driver 110 according to this embodiment may prevent the first transistor TR1 from being damaged by static electricity, owing to the first dummy transistor DTR1 and the second dummy transistor DTR2.

This will be described in greater detail; first, if static electricity is introduced from the second transistor TR2 or the third transistor TR3, the static electricity may short-circuit the second dummy source electrode DSE2 and the second dummy drain electrode DDE2 of the second dummy transistor DTR2. If the second dummy source electrode DSE2 and the second dummy drain electrode DDE2 are short-circuited, parts of the second dummy source electrode DSE2 and the second dummy drain electrode DDE2 may be electrically connected to each other. However, even if the parts of the second dummy source electrode DSE2 and the second dummy drain electrode DDE2 are electrically connected to each other, the second dummy source electrode DSE2 is in an electrically isolated state, so that the signal supplied from the second transistor TR2 may be transmitted to the first transistor TR1, regardless of the short-circuit of the second dummy source electrode DSE2 and the second dummy drain electrode DDE2.

Furthermore, if static electricity flows into the first dummy transistor DTR1 between the first transistor TR1 and the capacitor Cout, the static electricity may short-circuit the first dummy source electrode DSE1 and the first dummy drain electrode DDE1 of the first dummy transistor DTR1. If the first dummy source electrode DSE1 and the first dummy drain electrode DDE1 are short-circuited, parts of the first dummy source electrode DSE1 and the first dummy drain electrode DDE1 may be electrically connected to each other. However, if parts of the first dummy source electrode DSE1 and the first dummy drain electrode DDE1 are electrically connected to each other, capacitance of the capacitor Cout increases by a small amount, but a signal outputted from the first transistor TR1 may be transmitted to the scan lines S1, S2, S3, S4 and Sn regardless of the short-circuit of the first dummy source electrode DSE1 and the first dummy drain electrode DDE1.

As described above, a scan driver of the present disclosure is resistant to static electricity. Therefore, a display device having the scan driver may prevent performance from being degraded by static electricity.

Example embodiments have been disclosed herein. While the inventive concept has been described with respect to the specific embodiments, it will be apparent to those skilled in the art that various changes and modifications may be made without departing from the spirit and scope of the inventive concept as defined in the following claims.

What is claimed is:
1. A scan driver comprising:
   a plurality of stages configured to supply a scan signal to scan lines, the plurality of stages comprising a stage coupled to a scan line of the scan lines,
   wherein the stage comprises:
   a first transistor including a first gate electrode, a first drain electrode and a first source electrode and configured to output the scan signal to the scan line;
   a second transistor provided on a side of the first transistor and connected to the first drain electrode;
   a third transistor provided on the side of the first transistor and connected to the first source electrode;
   a capacitor provided between the scan line and the first transistor;
   a first dummy transistor provided between the first transistor and the capacitor and connected to the capacitor; and
   a second dummy transistor provided between the first transistor and the second transistor and connected to both the first transistor and the second transistor,
   wherein the first source electrode and the first drain electrode overlap with the first gate electrode, and wherein each of the first source electrode and the first drain electrode comprises a stem extending in one direction, and a plurality of branches protruding from the stem.

2. The scan driver according to claim 1, wherein the branches of the first source electrode protrude towards the stem of the first drain electrode, and the branches of the first drain electrode protrude towards the stem of the first source electrode, and
wherein the branches of the first source electrode and the first drain electrode are alternately arranged.

3. The scan driver according to claim 2, wherein the capacitor comprises:
a lower electrode connected to the first gate electrode; and
an upper electrode connected to the first drain electrode.

4. The scan driver according to claim 3, wherein the first dummy transistor comprises:
a first dummy gate electrode connected to the first gate electrode and the lower electrode and including amorphous silicon;
a first dummy drain electrode overlapping with the first dummy gate electrode and connected to the first drain electrode and the upper electrode; and
a first dummy source electrode overlapping with the first dummy gate electrode, the first dummy source electrode spaced apart from the first dummy drain electrode and connected to the upper electrode.

5. The scan driver according to claim 4, wherein each of the first dummy source electrode and the first dummy drain electrode comprises a stem extending in one direction and a plurality of branches protruding from the stem,
wherein the branches of the first dummy source electrode protrude towards the stem of the first dummy drain electrode and the branches of the first dummy drain electrode protrude towards the stem of the first dummy source electrode, and
wherein the branches of the first dummy source electrode and the first dummy drain electrode are alternately arranged.

6. The scan driver according to claim 4, wherein the second dummy transistor comprises:
a second dummy gate electrode connected to the first gate electrode and including amorphous silicon;
a second dummy drain electrode overlapping with the second dummy gate electrode and connected to the first drain electrode and the second transistor; and
a plurality of second dummy source electrodes overlapping with the second dummy gate electrode and spaced apart from the second dummy drain electrode.

7. The scan driver according to claim 6, wherein the second dummy drain electrode comprises a dummy stem extending in one direction and a plurality of dummy branches protruding from the dummy stem, and
wherein the second dummy source electrodes are electrically isolated from each other and the second dummy source electrodes and the dummy branches are alternately arranged.

8. The scan driver according to claim 1, wherein the first gate electrode comprises amorphous silicon.

9. A display device comprising:
a pixel unit configured to display an image;
a scan driver configured to supply a scan signal through a scan line to the pixel unit, and including a plurality of stages comprising a stage; and
a data driver configured to supply a data signal to the pixel unit,
wherein the stage comprises:
a first transistor including a first gate electrode, a first drain electrode and a first source electrode and configured to output the scan signal to the scan line;
a second transistor provided on a side of the first transistor and connected to the first drain electrode;
a third transistor provided on the side of the first transistor and connected to the first source electrode;
a capacitor provided between the scan line and the first transistor;
a first dummy transistor provided between the first transistor and the capacitor and connected to the capacitor; and
a second dummy transistor provided between the first transistor and the second transistor and connected to both the first transistor and the second transistor,
wherein the first source electrode and the first drain electrode overlap with the first gate electrode, and
wherein each of the first source electrode and the first drain electrode comprises a stem extending in one direction and a plurality of branches protruding from the stem.

10. The display device according to claim 9, wherein the branches of the first source electrode protrude towards the stem of the first drain electrode and the branches of the first drain electrode protrude towards the stem of the first source electrode, and
wherein the branches of the first source electrode and the first drain electrode are alternately arranged.

11. The display device according to claim 10, wherein the capacitor comprises:
a lower electrode connected to the first gate electrode; and
an upper electrode connected to the first drain electrode.

12. The display device according to claim 11, wherein the first dummy transistor comprises:
a first dummy gate electrode connected to the first gate electrode and the lower electrode and including amorphous silicon;
a first dummy drain electrode overlapping with the first dummy gate electrode and connected to the first drain electrode and the upper electrode; and
a first dummy source electrode overlapping with the first dummy gate electrode, the first dummy source electrode spaced apart from the first dummy drain electrode and connected to the upper electrode.

13. The display device according to claim 12, wherein each of the first dummy source electrode and the first dummy drain electrode comprises a stem extending in one direction and a plurality of branches protruding from the stem,
wherein the branches of the first dummy source electrode protrude towards the stem of the first dummy drain electrode and the branches of the first dummy drain electrode protrude towards the stem of the first dummy source electrode, and
wherein the branches of the first dummy source electrode and the first dummy drain electrode are alternately arranged.

14. The display device according to claim 12, wherein the second dummy transistor comprises:
a second dummy gate electrode connected to the first gate electrode and including amorphous silicon;
a second dummy drain electrode overlapping with the second dummy gate electrode and connected to the first drain electrode and the second transistor; and a plurality of second dummy source electrodes overlapping with the second dummy gate electrode and spaced apart from the second dummy drain electrode.

15. The display device according to claim 14, wherein the second dummy drain electrode comprises a dummy stem extending in one direction and a plurality of dummy branches protruding from the dummy stem, and wherein the second dummy source electrodes are electrically isolated from each other and the second dummy source electrodes and the dummy branches are alternately arranged.

* * * * *